United States Patent [19]

Rauscher

[11] Patent Number: 4,661,789
[45] Date of Patent: Apr. 28, 1987

[54] MICROWAVE RECURSIVE FILTER

[75] Inventor: Christen Rauscher, Fort Washington, Md.

[73] Assignee: The United States of America as represented by the Secretary of the Navy, Washington, D.C.

[21] Appl. No.: 755,757

[22] Filed: Jul. 17, 1985

[51] Int. Cl.$^4$ ........................ H03H 11/12; H01P 1/20
[52] U.S. Cl. .................................... 333/202; 330/103; 330/260; 330/286; 333/166
[58] Field of Search ................ 333/202, 204, 205–209, 333/167, 174, 165, 166; 330/103, 107, 109, 260, 286, 53; 328/165, 167; 364/824, 825, 826, 827, 724, 725, 727

[56] References Cited

U.S. PATENT DOCUMENTS

| | | | |
|---|---|---|---|
| 2,210,503 | 8/1940 | Shaw | 330/107 X |
| 3,356,962 | 12/1967 | Morgan | 330/107 X |
| 4,243,943 | 1/1981 | Cherry | 330/107 X |

OTHER PUBLICATIONS

"Analysis and Design of a Microwave Transistor Active Filter," Richard V. Snyder, Jr. and David L. Bozarch, IEEE Transactions on Microwave Theory and Techniques, vol. MTT-18, No. 1, Jan. 1970.
"Active Filters for UHF and Microwave Frequencies," David K. Adams and Raymond Y. C. Ho, IEEE Transactions on Microwave Theory and Techniques, vol. MTT, No. 9, Sep. 1969.
"Microwave Bandwidth Active Transversal Filter Concept with MESFETs" Wilhelm Jutzi, IEEE Transactions on Microwave Theory and Techniques, vol. MTT-19, Sep. 1971.

Primary Examiner—Marvin L. Nussbaum
Attorney, Agent, or Firm—John L. Forrest; William T. Ellis

[57] ABSTRACT

A broadband microwave recursive filter that provides sharp transitions in the frequency domain between adjacent stop and passbands comprising a signal input node; a signal output node; a filter circuit connected between the signal input node and the signal output node for providing a signal flow therebetween which has a predetermined frequency bandwidth characteristic; a microwave transistor circuit, with the microwave transistor circuit being band-limited to provide gain in only a restricted window of frequencies within the predetermined frequency bandwidth and connected for providing amplification to signals flowing in the filter circuit between the signal input node and the signal output node while suppressing out-of-window signals resulting from design approximations. The filter circuit includes a plurality of distributed feedback loop circuits, with each of the feedback loop circuits including the microwave transistor circuit therein, and wherein each of the feedback loop circuits has a different electrical length in relation to the other of the plurality of feedback loop circuits. Finally, the present filter design includes a passive filter connected in common to all of the plurality of distributed feedback loop circuits in the filter circuit for circuit for providing filter zeros on both sides of the restricted window of frequencies. In a preferred embodiment, the microwave transistor circuit includes an FET which is impedance-matched to obtain an approximately flat gain response across the window. It is preferred that the plurality of feedback loops all have amplitude weighting factors of the same sign.

5 Claims, 3 Drawing Figures

T = TRANSMISSION ELEMENT
F = FEEDBACK ELEMENT

GENERAL CONCEPT

——— MEASURED FILTER RESPONSE, — — — CALCULATED FILTER RESPONSE
······· CALCULATED CHARACTERISTIC OF AMPLIFIER SECTION BY ITSELF

MICROWAVE RECURSIVE FILTER

BACKGROUND OF THE INVENTION

The present invention is directed generally to broadband microwave filters, and in particular, to broadband recursive microwave filters that provide sharp transitions in the frequency domain between adjacent stopband passbands.

There is a need for microwave filters which have sharp transitions in the frequency domain between adjacent stopbands and passbands. This need is especially acute for very wideband signal systems which operate by chopping the wideband signal up into a series of contiguous smaller bandwidths, and then processing these individual smaller bandwidths. This type of wideband signal chopping into smaller contiguous bandwidths is required, for instance, in monolithic full-band millimeter-wave receivers for processing the ultra-wideband microwave I.F. signals that result. Typically, this signal chopping leads to individual smaller bandwidths of octave (or near-octave) bandwidths. However, if the transition between individual contiguous octave filters is not sharp in the frequency domain, then spurious frequency responses will be generated in a particular octave filter by signals adjacent to but not within the particular octave filter band. Such spurious signals are sometimes referred to by the term frequency aliasing.

At very low frequencies, active filters are commonly utilized in order to obtain the higher order transfer functions needed to provide sharp transitions between stopbands and passbands. Such active filters are advantageous at these low frequencies because they have the ability not only to compensate for parasitic losses affiliated with passive circuit elements, but also to provide overall amplification. However, the direct transposition of low-frequency design principles to the microwave range is impeded by the lack of appropriate broadband, high-gain devices to perform operational amplifier functions. Additionally, a principal limiting factor of current microwave active devices is that such active devices have an intrinsic time delay. Accordingly, most of the interest in microwave active filters has concentrated on alternate approaches in which individual reactances and resonators are replaced with microwave active substitutes that yield higher-Q performance.

OBJECTS OF THE INVENTION

Accordingly, it is an object of the present invention to provide a broadband microwave filter that has a sharp transition in the frequency domain between adjacent stopband passbands.

It is a further object of the present invention to achieve wideband filtering of up to an octave, in conjunction with sharp cut-off characteristics at the band edges.

It is still a further object of the present invention to provide a broadband microwave filter that has a sharp cut-off characteristic at the band edges while utilizing a minimum number of active devices.

It is yet a further object of the present invention to provide a wideband microwave filter with improved circuit Q and reduced size.

It is still a further object of the present invention to provide a broadband microwave filter with sharp transitions in the frequency domain between adjacent stopbands and passbands utilizing transistors, while avoiding the gain and time delay limitations normally associated with the use of such transistors.

Other objects, advantages, and novel features of the present invention will become apparent from the detailed description of the invention, which follows the summary.

SUMMARY OF THE INVENTION

Briefly, the present invention comprises a broadband microwave recursive filter that provides sharp transitions in the frequency domain between adjacent stopbands and passbands, and comprises a signal input node; a signal output node; a filter circuit connected between the signal input node and the signal output node for providing a signal flow therebetween which has a predetermined frequency bandwidth characteristic, the filter circuit including a plurality of distributed feedback loop circuits; a two-port microwave transistor circuit which is band-limited for providing gain in only a restricted window of frequencies within the filter circuit's predetermined frequency bandwidth and for providing amplification to signals flowing between the signal input node and the signal output node while suppressing out-of-window signals resulting from design approximations; wherein each of the feedback loop circuits include the microwave transistor circuit therein, and wherein each of the feedback loop circuits has a different electrical length in relation to the other of the plurality of feedback loop circuits to provide the filter circuit's predetermined frequency characteristic; and one or more passive filters included in the feedback loop circuits for providing transmission zeros at each end of the restricted window of frequencies.

In a preferred embodiment, the plurality of feedback loops in the filter circuit all have amplitude weighting factors of the same sign and the microwave transistor is an FET impedance-matched to obtain an approximately flat gain response across the window. It is also preferred that the one or more passive filters be common to all of the plurality of distributed feedback loops.

DETAILED DESCRIPTION OF THE PREFERRED EMBODIMENT

Figure 1:
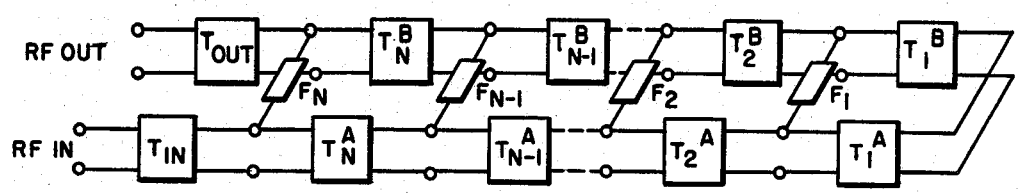
FIG. 1 is a schematic block diagram of a generalized recursive filter circuit.

A generalized schematic of the recursive filter of the present invention is shown in FIG. 1. This schematic embodiment is composed of transmission elements labeled with the designation "T" and feedback elements labeled with the designation "F", with the labels having various identifying indices associated with them. In the present design, any one of these transmission elements "T" may contain one or more of the following:

(a) simple transmission lines, including the degenerate case of zero line length;

(b) passive or active filter structures; and (c) active devices, such as transistors, with appropriate impedance matching elements. The feedback elements may be any two-terminal elements, but are typically composed of Rs, Ls, and Cs.

The basic recursive portion of the filter of the present invention comprises the transmission elements $T_k$, $k=1, \ldots, N$, and the feedback elements $F_k$, $k=1, \ldots, N$. The transmission elements $T_{in}$ and $T_{out}$ provide additional flexibility and can be used to implement window functions and/or achieve supplementary amplification and filtering.

A recursive filter typically may be regarded as a tandem combination of a transversal section and a feedback-only section. The presence of the feedback constitutes a very powerful extension relative to a strictly transversal process, permitting poles of transmission of arbitrarily high Q factors to be realized. Introduction of such poles (where in the limit, the transfer function of the filter may go to infinity, i.e., the filter begins to oscillate) permits the generation of significant gain. However, introduction of such poles in order to obtain significant gain makes the filter sensitive and introduces stability concerns.

The recursive filter characteristics are the result of the interaction between time-delayed signal components. Under the assumption that particular time delays are multiples of some common minimum delay $\tau = 2\pi/\omega_s$, where 107 $_s$ is the frequency at which the periodic transfer function repeats itself, the recursive transfer function of a structure with $M+1$ feedforward branches and $N$ feedback branches can be written in the form $$H_R(j\omega) = \frac{\sum_{m=0}^{M} \alpha_m \cdot e^{-j2\pi m\omega/\omega_s}}{1 + \sum_{n=1}^{N} \beta_n \cdot e^{-j2\pi n\omega/\omega_s}} \quad (1)$$

In this equation, $\omega$ is the angular frequency, $\alpha_m$ represents the transversal amplitude weighting factors, and $\beta_n$ represents the recursive amplitude weighting factors. Note that in this equation, the numerator represents the sum of the various transversal terms, while the denominator represents the sum of the various recursive or feedback terms. In the present design, for ease of explanation, it is assumed that there are no transversal terms, such that the numerator of the equation is a constant. Accordingly, the basic design task is to determine the coefficient values $\beta_n$, $n=1, 2, \ldots, N$, that yield the best approximation to a prescribed target response function. A number of methods may be utilized to determine the $\beta_n$ coefficients. One such method is the impulse response method. However, this method gives rise to various disturbing aliasing effects. An alternate method for determining the coefficients $\beta_n$ is to use the bilinear transformation method. This method is used to derive the recursive filter response from an appropriate lumped-element prototype response. Using this method, a bilinear-type transformation is defined which establishes correspondance between the frequency variable $j\Omega$ in the lumped-element domain and the frequency variable $j\omega$ in the distributed domain, according to some chosen substitution formula $j\Omega = F(j\omega)$. Two examples of such $F(j\Omega)$ transformations are listed in equations 2 and 3 below.

$$F(j\omega) = \frac{\Omega_c}{\tan \pi\omega_c/\omega_s} \cdot \frac{1 - e^{-j2\pi\omega/\omega_s}}{1 + e^{-j2\pi\omega/\omega_s}}, \quad (2)$$

$$F(j\omega) = \Omega_c \tan \pi\omega_c/\omega_s \cdot \frac{1 + e^{-j2\pi\omega/\omega_s}}{1 - e^{-j2\pi\omega/\omega_s}}. \quad (3)$$

In these equations, the terms $\Omega_c$ and $\omega_c$ are the designated cut-off frequencies in the respective domains, while the term $\omega_s$ is the symmetry frequency at which the periodic transfer function repeats itself, where $\omega_s = 2\pi/\tau$. Utilizing these transformations results in a nonlinear distortion of the prototype frequency axis such that no aliasing effects occur.

In order to employ the above bilinear transformation method, the desired target response for the recursive transfer function must be translated into the $j\Omega$ domain. The magnitude of the resulting prototype target response is arrived at through application of the inverse frequency variable transformation to the corresponding $j\omega$-domain response by way of the substitution $j\omega = F^{-1}(j\Omega)$. Standard synthesis techniques are then utilized to find a rational function in terms of this prototype-domain frequency variable that represents the prototype target response along the $j\Omega$ axis. Once such a function has been established, it may then be frequency transformed back to the $j\omega$ domain to yield the recursive filter response.

This response function assumes the form of a rational function in various powers of $e^{-j2\pi\omega/\omega_s}$. These powers reflect signal contributions of specific time delays $K \cdot 2\pi/\omega_s$, $K=0, 1, \ldots$ The denominator terms describe the recursive part of the transfer function. Corresponding coefficients are the $\beta$-coefficients. (The numerator terms describe the transversal part of the function with its $\alpha$-coefficients).

The $\beta$ coefficients will, in general, comprise a mix of positive and negative coefficients, with corresponding signal contributions summed to provide the desired filter signal response. These terms will tend to add in-phase across the band of frequencies where the response is to be a linear passband, and will add out-of-phase at the edges of the passband in order to provide the signal response zeros. However, the combination of both positive and negative coefficients requires the capability in the circuit for reversing the signal phases over wide microwave frequency ranges.

Signals with positive and negative coefficients can be obtained in a microwave environment by splitting an incident signal into two signals of opposite phase and then utilizing separate delay lines to derive the required signal component with the appropriate delay and sign. However, this approach requires a disproportionate amount of circuit board area. Alternately, a single feed line could be used and the sign requirements could be satisfied by using microwave active devices in both inverting and non-inverting configurations. However, this approach sacrifices design uniformity by typically requiring amplifier sections with different reflection, isolation, and delay characteristics.

In order to avoid opposite sign terms in the present design, an approximation approach is utilized to approximate negative $\beta$ coefficient terms with positive $\beta$ coefficient terms. These approximate substitution terms may be determined, by way of example, according to the following equation:

$$\beta_n \cdot e^{-j2\pi n\omega/\omega_s} \approx -\beta_n Y \cdot [e^{-j2\pi(n-1)\omega/\omega_s} + e^{-j2\pi(m+1)\omega/\omega_s}], \quad (4)$$

for $\beta_n/\beta_{n/2}<0$, and $n>0$. For more information on this substitution process, see the paper by C. Rauscher, "Microwave Active Filters Based on Transversal and Recursive Principles" IEEE Trans. Microwave Theory Techn. Typically, the empirical parameter $\gamma$ will be in the vicinity of 0.6 in order to render the approximation useful over bandwidths of on the order of an octave. Furthermore, if the contribution by a given $\beta$ term is judged to be negligible, it may be convenient to delete it all together.

The above-described substitutions and deletions of the various $\beta$ terms result in some passband deviations from the original desired response. These passband deviations can be obviated by means of computer optimization to adjust the pertinent parameters and bring the filter response back in line with the desired filter response. This computer optimization is also used to compensate for the microwave circuit parasitic effects. There are a variety of computer optimization programs well known in the art for accomplishing the above described optimization. Typically, these computer optimization programs function by generating an error function, such as the least-squares function. By way of example, and not by way of limitation, various IMSL subroutine library programs or the program COMPACT may be utilized for optimization purposes.

It should be noted that the approximations obtained from equation 4 in order to allow the use of $\beta$ weighting coefficients of only one sign cause a signal response breakdown in the stopband. At points where zeros of transmission should occur in the desired response, the recursive filter components actually add up to produce maximums of transmission.

In order to control this stopband behavior as well as perform the functions of the disregarded $\alpha$-coefficients, one or more window functions must be added to the design. In a preferred embodiment, a microwave active device which is intrinsically band-limited, in combination with passive matching circuitry and a separate passive filter segment are added to the filter design. The microwave active device with its matching elements should provide appreciable gain roll-off beyond the passband edges, but offer flat amplification within the passband, so as not to interfere with the main recursive bandpass operation.

Figure 2:
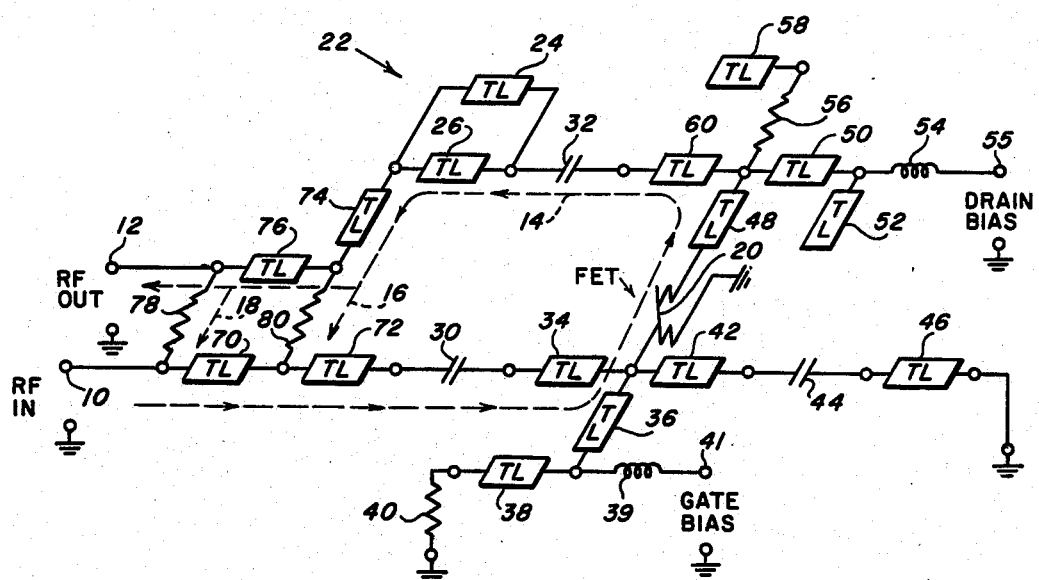
FIG. 2 is a schematic block diagram of a preferred embodiment of the present invention.

A preferred embodiment of the present design is shown in FIG. 2. This filter was designed to achieve a 9-15 GHz triple-hump bandpass response, with stopbands spanning the frequency ranges from 5-8 GHz and 16-19 GHz. In essence, the passband characteristic is centered around $\omega_s/4\pi = 12$ GHz. The recursive solution that resulted from the use of the high-pass-type bilinear transformation, and one-sign-only $\beta$ approximations, together with the deletions of less significant terms, resulted in two feedback loops with affiliated feedback resistors, in combination with a windowing amplifier section and a passive filter segment to assist in defining the bandpass characteristics.

The basic recursive filter embodiment shown in FIG. 2 comprises an RF input node 10, and RF output node 12, and a filter circuit with a basic signal path 14 and including a first feedback loop 16 and a second feedback loop 18. The circuit further includes a microwave amplifier section comprising active microwave device 20 with matching circuitry for providing amplification, delay, and windowing to the filter circuit. Finally, this circuit includes a passive filter 22 which, in the present embodiment, is comprised of two parallel connected transmission lines 24 and 26.

Referring first to the microwave amplifier section, this section is comprised in FIG. 2 of the FET 20 with its attendant matching circuits. In essence, the amplifier section encompasses all circuit elements to the right of a set of blocking capacitors 30 and 32. These blocking capacitors 30 and 32 are necessary in order to prevent any of the dc biasing current for the FET from undesirably propagating into other parts of the filter.

The standard FET 20 has a gain function which decreases approximately as a straight line from lower frequencies to higher frequencies. In order to obtain a flat gain characteristic at the bandwidth of interest, the gain at the lower end of the frequency band must be reduced. Additionally, the FET has certain parasitic capacitances which must be compensated.

The transmission line elements 34, 36, 38, 42, 46, 48, 50, 52, 58, and 60, the resistors 40 and 56, the inductors 39 and 54, and the capacitor 44 comprise the matching circuit and the biasing circuit for the FET 20. More specifically, the transmission lines 36 and 38 and the resistor 40 operate to reduce the lower frequency gain response of the FET 20. The transmission lines 36 and 38 are used to impedance match the resistor 40 to the FET gate. In essence, the resistor 40 is shunted between the gate and the source terminals of the FET 20 at low frequencies. This shunting operation of the resistor 40 occurs because at low frequencies, the impedance of the FET 20 is very high, thereby shunting the signal into the resistor 40. However, at higher frequencies, the impedance of the FET 20 drops such that the effects of resistor 40 become less noticeable in the circuit.

A bias voltage is applied to the gate by means of a terminal 41, an inductor 39, and the transmission line 36. The inductor 39 operates as an RF choke to prevent the RF signal from being dissipated in the biasing circuitry.

The transmission lines 42 and 46 are specifically chosen in length to provide a shunt inductance compensation to the gate of the FET 20 in order to compensate for the parasitic capacitance of the FET gate.

The output impedance of the FET 20 is also capacitive. In order to compensate for this capacitive output of the FET, a transmission line 48 is connected to the drain of the FET 20. At the other end of the transmission line 48 are connected the transmission lines 50 and 52 and the resistor 56 and the transmission line 58. The combination of the transmission lines 48, 50, 52, 58, and the resistor 56 help tune out the capacitive affects at the output of the FET.

A dc bias is applied to the drain of the FET 20 via a contact point 55. An inductor 54 is connected between the contact point 55 and the drain to act as a choke inductor to prevent high frequency signals from leaking out through the bias path at the contact point 55.

Figure 3:
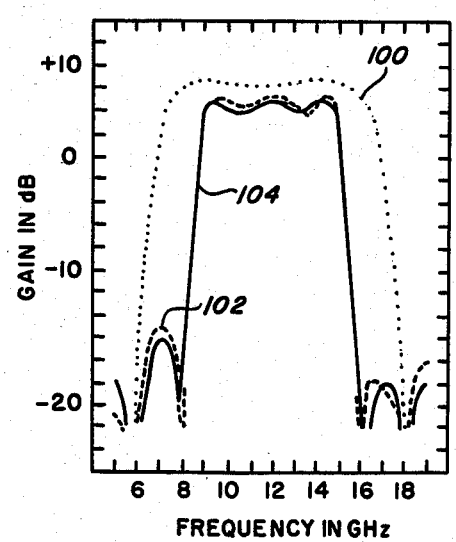
FIG. 3 is a graph of the gain v. frequency response curve for the recursive filter shown in FIG. 2.

The FET 20 in combination with its matching network of transmission lines, capacitors, inductors, and resistors, constitutes an 8-to-16 GHz broadband amplifier, and serves as part of the lowest order transmission module. By way of example, the FET 20 may be implemented by an Avantek M126 sub-half-micron device biased at $\frac{1}{2}I_{DSS}$ and at a drainsource voltage of $V_{DS}=+3.0$ V. The transfer response of this FET amplifier section is shown in FIG. 3 by the dotted line curve 100. The passband for this amplifier FET 20 is intentionally designed to be wider than the actual filter response so as to reduce sensitivity of the critical filter skirts to transistor-related tolerance effects.

As noted previously, an additional passive filter 22 is included in the circuit in order to aid the shaping of the filter characteristic by introducing zeros of transmission at 6, 8, 16, and 18 GHz. In the embodiment shown in FIG. 2, this passive filter 22 was comprised of the parallel connection of two 100 ohm transmission lines with lengths chosen such that the signals propagating therethrough are added in-phase in the center of the passband of interest, but are added 180° out-of-phase to cancel at the desired zero points in the response function. In this particular embodiment, the transmission line lengths for the transmission lines 24 and 26 were chosen to be equivalent to a quarter wave and a five quarter wave length, respectively, at the band center of 12 GHz. Accordingly, at band center, there is a difference of 360° in the phases of the two signals when they are added together after propagation through the passive filter 22, thus ensuring that signals around the band center will be passed.

As noted previously, the present recursive filter includes two feedback loops 16 and 18. Each of these circuit loops requires a certain amount of feedback loop time delay. A portion of this time delay is inherently provided by the FET 20 and its attendant matching circuitry. Additional feedback loop delay is provided by the passive filtering section 22. The transmission line elements 70, 72, 74, and 76 provide the remaining time delays to implement the entire desired delays for the feedback loops. The transmission line elements 72 and 74 are common to both of the feedback loops 16 and 18. However, the feedback loop 18 includes the delay element 76 with a first and second ends which is not common to any of the other of the feedback loops in the circuit and is connected at one end to the RF output node 12. This feedback loop 18 further includes a resistive element 78 which is not common to any of the other of the feedback loops in the circuit and which is connected between the RF output node 12 and the RF input node 10. Finally, in the embodiment of FIG. 2, the feedback loop 18 includes the delay line 70 which is connected at a first end to the RF input node 10 and at a second end thereof indirectly to the gate of the FET 20. The other feedback loop 16 includes a resistive element 80 which is not common to any of the other of the feedback loop circuits and is connected at one end thereof to the second end of the delay line 76 and is connected at the other end thereof to the second end of the delay line 70.

The calculated frequency response characteristic for this filter is shown by the dashed line curve 102 in FIG. 3. The actual measured filter response characteristic for the recursive filter of FIG. 2 is shown by the solid line curve 104 in FIG. 3.

By way of example and not by way of limitation, the following specific circuit element values may be utilized to implement the embodiment of the present invention shown in FIG. 2. Note that all electrical lengths $\theta$ are for the midband frequency of 12 GHz.

| | | | | | |
|---|---|---|---|---|---|
| $TL_{70}$: | $Z_o = 50\Omega$ | $\theta = 210°$ | $TL_{50}$: | $Z_o = 75\Omega$ | $\theta = 84°$ |
| $TL_{72}$: | $Z_o = 50\Omega$ | $\theta = 50°$ | $TL_{52}$: | $Z_o = 50\Omega$ | $\theta = 90°$ |
| $TL_{34}$: | $Z_o = 35\Omega$ | $\theta = 78°$ | $TL_{58}$: | $Z_o = 65\Omega$ | $\theta = 180°$ |
| $TL_{36}$: | $Z_o = 85\Omega$ | $\theta = 35°$ | $TL_{60}$: | $Z_o = 50\Omega$ | $\theta = 30°$ |
| $TL_{38}$: | $Z_o = 85\Omega$ | $\theta = 100°$ | $TL_{26}$: | $Z_o = 100\Omega$ | $\theta = 90°$ |
| $TL_{42}$: | $Z_o = 40\Omega$ | $\theta = 12°$ | $TL_{24}$: | $Z_o = 100\Omega$ | $\theta = 450°$ |
| $TL_{46}$: | $Z_o = 40\Omega$ | $\theta = 32°$ | $TL_{74}$: | $Z_o = 50\Omega$ | $\theta = 10°$ |
| $TL_{48}$: | $Z_o = 95\Omega$ | $\theta = 34°$ | $TL_{76}$: | $Z_o = 50\Omega$ | $\theta = 330°$ |
| $C_{30} = C_{32} = 10$ pF | | | | | |
| $C_{44} = 20$ pF | | | | | |

-continued $L_{39} = L_{54} = 15$ nH
$R_{40} = 100\Omega$
$R_{56} = 25\Omega$
$R_{80} = 820\Omega$
$R_{78} = 680\Omega$ $FET_{20}$: Avantek M126

It should be noted that a number of additional external window functions may be added to the present design.

The present circuit was constructed on a 0.25 mm thick fiberglass-reinforced Teflon substrate, with coaxial 50 ohm adapters at the input and the output. Noise figures were measured at 1 GHz intervals within the 9-to-15 GHz passband. The values of the noise decreased from a maximum reading of 7.8 dB at the lower band edge to a minimum of 5.2 dB at 14 GHz, before rising to 5.9 dB at the upper band limit. These noise numbers indicate a noise advantage for the recursive filter in comparison to previous designs including the transversaltype designs.

It should be noted that the present design does not require the location of the amplifier section to be common to all or a plurality of the feedback loops in the filter. In this regard, an active amplifier section could be located in a portion of each feedback loop which is not common to the other feedback loops. Likewise, the desired windowing effect of the active amplifier section may be obtained by inserting the amplifier either before the filter section or after the filter section. However, in order to minimize size and elements and, in particular, the number of transistors used, it was deemed to be desirable to provide the active amplifier windowing function by means of a single amplifier which is common to all of the feedback loops in the filter circuit. The above comments also hold for the passive filter section 22. This passive filter section may be disposed at the input to the main microwave filter or at the output of the main microwave filter, or a separate passive filter section may be disposed in each feedback loop in an uncommon portion of that feedback loop. However, in order to reduce circuit size, the passive filter section was disposed to be common to all of the feedback loops in the main microwave filter. Note that the amplifier section with the FET 20 performs the multiple functions of providing gain for the circuit loops, providing windowing for the desired filter frequency response, and providing a portion of the time delay required in the feedback loops 16 and 18. Note that the elements of the passive filter section 22 perform the dual function of providing the passive filtering while also contributing to the time delay for the individual feedback loops 16 and 18.

In order to impose a sense of direction on each of the feedback loops 16 and 18, and thereby allow the feedback scheme to operate as intended, the levels of the individual signals fed back through the nondirectional impedance elements 78 and 80 should exceed, by a comfortable margin, the levels of parasitic contributions fed forward through the same elements. This is accomplished through the assignment of gain functions to the loops 16 and 18 in order to introduce an appropriate differential between the output and the input relative signal levels. This gain function is implemented in the circuit of FIG. 2 simply by the amplifier section with the FET 20. Note that this appropriate differential in the output and the input relative signal levels permits the use of high resistance values for the feedback resistors 78 and 80 to thereby minimize perturbations in the input and the output lines.

It should be noted that the same basic concept utilized in the present recursive filter may also be utilized in designing transversal filters. In this regard, a transversal filter composed of a plurality of feedforward circuit loops may be utilized to obtain a desired filter response. In designing this transversal filter, the various coefficients for the different feedforward signal paths may be set so that there are no opposite sign terms, i.e., so that there are no negative coefficients. This may be accomplished by utilizing an approximation equation, such as the one set forth in equation 4 of the present disclosure. Additionally, the insignificant terms may be dropped from this feedforward filter design. In order to delete the undesired out-of-band response of this filter caused by the above-described approximations, a series of window function circuits may be utilized in combination with this transversal filter design. More specifically, an active amplifier section may be utilized which is inherently band-limited to thereby provide the windowing function and the desired gain for the circuit. Additionally, a passive filter section may be included to provide zeros at specific locations in the filter response. As noted above for the recursive design, the transversal filter design may utilize the amplifier section and the passive filter section either prior to the transversal feedforward loops or at the output of the transversal filter, or an individual passive filter and amplifying section may be utilized in each separate feedforward path, or in a portion of the transversal filter which is common to all of the feedforward loops.

Referring again to the recursive filter design of the present invention, one of the principle attractions of the present approach is that the active filter segment and the passive filter segment are incorporated into the overall filter design in such a manner that their associated time delays contribute to the delays already required for the realization of the recursive process. This design feature leads to very compact filter circuits. Accordingly, the present design is especially advantageous in microwave applications where space is at a premium.

It should also be noted that in the present design, the time delays do not have to be multiples of some prescribed lowest-order time delay, as is otherwise generally the case in digital recursive filters. This feature provides extra degrees of design freedom.

It should also be noted that opposite-sign feedback signals have been approximated by using a section of transmission line to achieve the 180° phase shift at midband. This permits the recursive filter design to include only one type of active element configuration, such as a common source configuration in the case of FET active elements.

In essence, the present design including the combination of the recursive filter feedback loops, with the passive filter structure and the amplifier section both integrated into the recursive filter feedback loops, provides an extremely compact structure with a minimum of circuit elements and, in particular, a minimum of active circuit elements.

It should be noted that the present invention is not limited to the use of FETs in the active amplifier portion of the design. In this regard, any type of transistor or active two-port device may be utilized. In addition, it should be noted that various feedforward paths may be incorporated into the present recursive structure in order to provide additional design freedom.

It should be noted that the recursive approach to obtaining a particular frequency response characteristic enjoys a significant advantage over similar transversal approaches through the availability of powerful feedback options. This recursive approach also tends to be more receptive to the efficient integration of active devices and passive filter segments into the recursive filter structure. This integration permits the time delays associated with the active devices and the passive filter segments to be used constructively, thereby allowing circuit dimensions to be minimized. Moreover, the present recursive filter design does not require the space-consuming junction elements as does a typical transversal filter design. Although the recursive filter structure with the poles in its transfer function gives the appearance of being more suseptible to instability than transversal-type circuits, parasitic feedback within typical microwave active 2-port devices tends to disallow any meaningful distinction in practical design situations.

The principle function of the feedforward terms in the numerator is to establish the zeros of transmission for the recursive filter. The implied reliance on transversal principles to achieve the zeros quite often represents, however, an inefficient use of resources when compared to conventional passive filter alternatives. Accordingly, to implement this function, the numerator of the recursive filter response expression is split off, with the zeros provided by the passive filter section noted previously.

From the above, it can be seen that a broadband microwave filter has been realized that has sharp transitions in its frequency domain between adjacent stopband and passbands.

Obviously, many modifications and variations of the present invention are possible in light of the above teachings. It is therefore to be understood that within the scope of the appended claims, the invention may be practiced otherwise than as specifically described.

What is claimed and desired to be secured by Letters Patent in the United States is:

1. A broadband recursive filter that provides sharp transitions in the frequency domain between adjacent stop and passbands, comprising:
   a signal input node;
   a signal output node;
   a filter circuit connected between signal input node and said signal output node for providing a signal flow therebetween which has a predetermined frequency bandwidth characteristic, said filter circuit including a plurality of distributed feedback loop circuits
   a microwave transistor circuit including an output port, said microwave transistor circuit being band-limited for providing gain in only a restricted window of frequencies within said predetermined frequency bandwidth for providing amplification to said signal flowing between said signal input node and said signal output node while suppressing out-of-window signals resulting from design approximations said transistor circuit further including an FET which is impedance-matched to obtain an approximately flat gain response across said window and wherein each of said feeedback loop circuits in said filter circuit include said FET therein;
   wherein said plurality of feedback loop circuits comprises:

a first feedback loop which includes a first delay line with a first and second ends and which is not common to any of the other of said plurality of feedback loop circuits and is connected at said first end to said output node, a first resistive element which is not common to any other of said plurality of feedback loop circuits and which is connected between said output node and said input node, and a second delay line connected at a first end to said input node and at a second end thereof indirectly to the gate of said FET; and a second feedback loop which includes a second resistive element, not common to any other of said plurality of feedback loop circuits, and which is connected at one end to the second end of said first delay line and connected at the other end to the second end of said second delay line;

wherein each of said feedback loop circuits has a different electrical length in relation to the other of said plurality of feedback loop circuits; and at least one passive filter connected to said microwave transistor circuit for providing filter response zeros on both sides of said restricted window of frequencies.

2. A recursive filter as defined in claim 1, wherein said plurality of feedback loops all have amplitude weighting factors of the same sign.

3. A recursive filter as defined in claim 1, wherein said at least one passive filter is common to all of said plurality of distributed feedback loop circuits.

4. A recursive filter as defined in claim 1, wherein said at least one passive filter has a first and second ends, with its first end connected to the output port of said microwave transistor circuit; and wherein a third delay line is common to both said first and second feedback loops and is connected at one end thereof to said second end of said first delay element and at its other end to the second end of said at least one passive filter.

5. A recursive filter as defined in claim 4, wherein said at least one passive filter comprises two unequal delay lines connected in parallel between the first and second ends of said at least one passive filter, with the delays being set to provide zeros at approximately the ends of said restricted window of frequencies.

* * * * *